United States Patent [19]

Torre et al.

[11] 4,336,492

[45] Jun. 22, 1982

[54] APPARATUS FOR TESTING AN HERMETIC SEAL IN A GLASS CATHODE RAY TUBE

[75] Inventors: Alton J. Torre, Wheaton; Victor R. Schuster, Chicago, both of Ill.

[73] Assignee: Zenith Radio Corporation, Glenview, Ill.

[21] Appl. No.: 146,970

[22] Filed: May 5, 1980

[51] Int. Cl.³ .................. G01R 31/16; G01R 31/24; H01J 9/42
[52] U.S. Cl. ........................................ 324/54; 324/404
[58] Field of Search .................... 324/54, 404

[56] References Cited

U.S. PATENT DOCUMENTS

| | | | |
|---|---|---|---|
| 1,779,907 | 10/1930 | Dye | 324/54 |
| 2,573,815 | 11/1951 | Smith | 324/54 X |
| 2,866,156 | 12/1958 | Lane | 324/54 |
| 2,885,636 | 5/1959 | Rasor | 324/54 |
| 2,900,597 | 8/1959 | Gooding | 324/54 |
| 3,015,692 | 1/1962 | Herrington | 324/404 X |
| 3,735,251 | 5/1973 | Britton | 324/54 |
| 3,943,438 | 3/1976 | Barber et al. | 324/54 |

Primary Examiner—Gerard R. Strecker
Attorney, Agent, or Firm—Ralph E. Clarke, Jr.

[57] ABSTRACT

An apparatus for testing an hermetic, glass-like frit seal interposed between the funnel and faceplate of an in-process cathode ray tube is disclosed. A discontinuity in the hermetic seal causes a high voltage breakdown in the seal when a test voltage is applied to the cathode ray tube. The apparatus comprises an elastomeric band which is capable of being stretched over the tube, conforming to the shape of the hermetic seal between the funnel and faceplate. The apparatus also comprises band-mounting means which holds the elastomeric band and stretches the band to fit around the hermetic seal such that the band forms electrical and mechanical contact with the frit seal. The improvement comprises electrically conductive spring means embracing the elastomeric band at its periphery. The spring means are attached to the band mounting means for stretching and relaxing in concert with the elastomeric band. The spring means provides for more uniform grounding of the band with respect to the frit seal and the additional inward pressure against the band exerted by the spring means provides for more intimate electrical grounding contact of the band with the frit seal.

2 Claims, 3 Drawing Figures

APPARATUS FOR TESTING AN HERMETIC SEAL IN A GLASS CATHODE RAY TUBE

BACKGROUND OF THE INVENTION AND PRIOR ART DISCLOSURE

This invention relates to the manufacture of cathode ray tubes for television receivers. The invention comprises an improvement in an apparatus for testing the hermetic qualities of the seal interposed between the front panel and the funnel of a cathode ray tube. The apparatus is that described and claimed in U.S. Pat. No. 3,943,438, assigned to the assignee of the present invention. The substance of the disclosure of U.S. Pat. No. 3,943,438 is fully incorporated herein by reference.

The apparatus disclosed in the referent patent provides for first stretching then relaxing an elastomeric band over the hermetic, glass-like frit seal of an in-process cathode ray tube. The inner conductive coating of the cathode ray tube is charged to a high test voltage, while the band is established at ground potential. A discontinuity in the hermetic seal causes a high voltage breakdown at the point of discontinuity when the test voltage is applied. The breakdown activates appropriate circuits which shut off the high voltage and provide an indication of the breakdown condition.

The elastomeric band is made conductive by impregnating it with graphite. A fairly high concentration of graphite is required to ensure minimum electrical resistance so that the band provides an adequate ground at all points of contact with the frit seal, and does so without introducing a high resistance into the electrical test circuit. However, the amount of graphite required for adequate electrical conductivity also renders the band brittle and subject to rupture. If the band is made more elastic by the addition of less graphite, the resistance of the band will be such as to render the testing ineffectual at points distance from the place of introduction of the ground potential and any possible discontinuity.

OBJECTS OF THE INVENTION

It is a general object of the invention to provide an improvement in a patented apparatus for in-process testing of a color cathode ray tube.

It is a less general object of the invention to provide an improvement in an apparatus for testing the hermetic seal interposed between the faceplate and funnel of a cathode ray tube.

It is a more specific object of the invention to provide for more positive discontinuity testing of the faceplate-funnel frit seal of a cathode ray tube.

BRIEF DESCRIPTION OF THE DRAWINGS

The features of the present invention which are believed to be novel are set forth with particularity in the appended claims. The invention, together with further objects and advantages thereof, may best be understood by reference to the following description taken in conjunction with the accompanying drawings, in the several figures of which like reference numerals identify like elements, and in which:

DESCRIPTION OF THE PREFERRED EMBODIMENT

Figure 1:
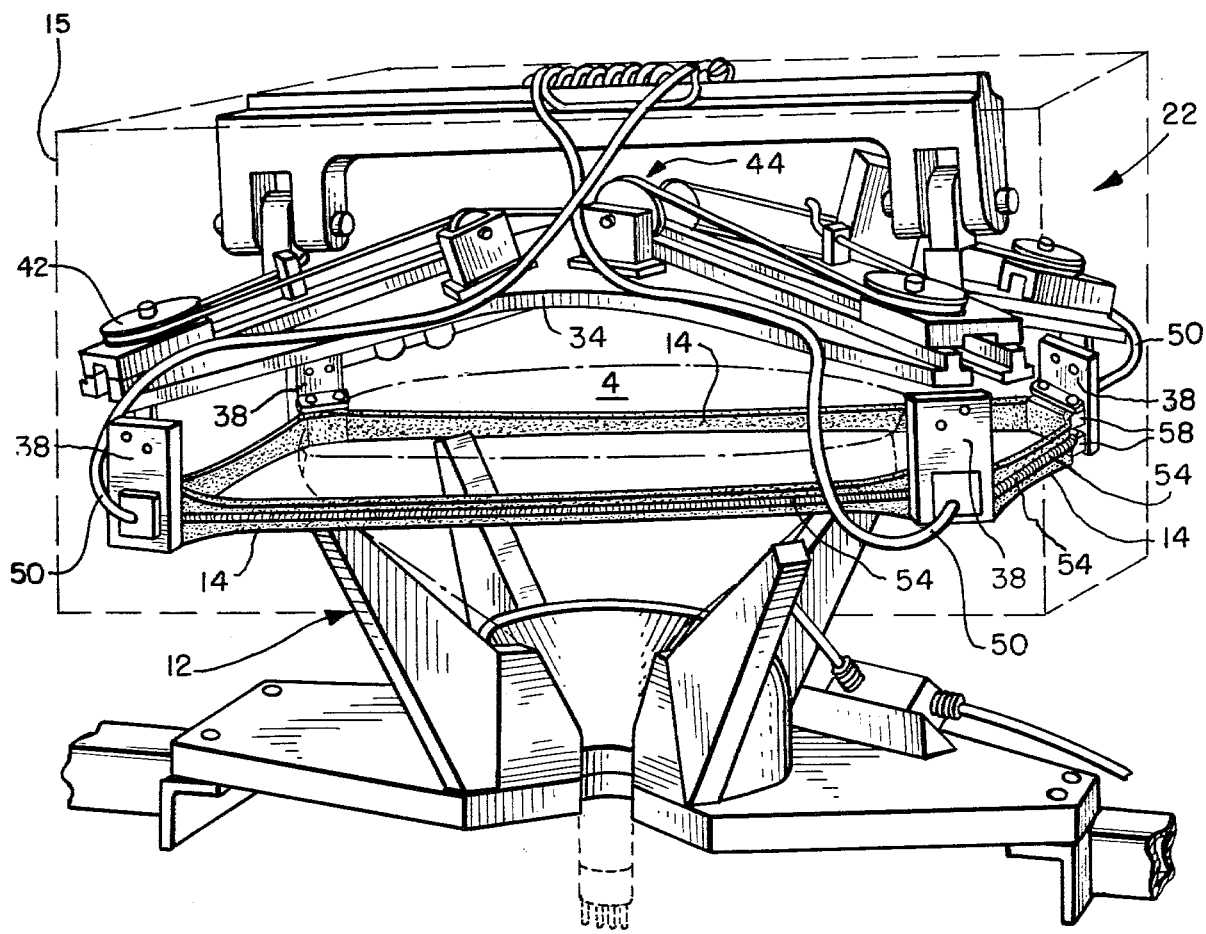
FIG. 1 is a perspective view of a cathode ray tube cradle and the handfinger-like structure of a cathode ray tube test apparatus having improved frit seal testing means according to the invention.

Testing of the frit seal of a cathode ray tube according to the referent U.S. Pat. No. 3,943,438 is accomplished as follows (see FIG. 1).

A cathode ray tube having a faceplate 4 is placed in a supporting cradle 12. A sensor (not shown) located in the cradle senses the presence or absence of the cathode ray tube and energizes appropriate circuits to commence the testing procedure. A high voltage test lead is attached to the anode button of the cathode ray tube, supplying a potential of 40 to 50 kilovolts to the inner conductive coating of the funnel. Band-mounting means 15, comprising components encompassed by the dash line, include a handfinger-like structure 22 which is in its highest upward position when a test is not in process, and when activated, commences its vertical downward movement which is arrested when the sensor buttons on the under side of the domed hand 34 contact faceplate 4 of the supported cathode ray tube.

During the time the elastomeric band 14 is not in contact with a tube, the fingers 38 are fully extended thereby stretching the band 14 a sufficient amount to allow the band to wrap around large-size tubes. When the domed hand 34 is resting on the faceplate, the four fingers 38 are energized by means of the cable and pulley system 42–44, and in combination with the elastic properties of the band 14, effect mechanical and electrical contact between the band 14 and the frit seal of the cathode ray tube. Once such contact is established, energization of the high voltage power supply establishes the high-voltage test application across the frit seal.

A discontinuity occuring or existing in the frit seal effects a current flow from ground through a meter relay, through the electrically conductive elastomeric band 14, and through the discontinuity in the frit seal to the high voltage power supply. Appropriate circuitry is energized to shut off the high voltage supply, contemporaneously energizing the cable-pulley mechanism effecting the movement of the pulley-finger combination 42–44 which stretches elastomeric band 14, causing the band to lose contact with the cathode ray tube frit seal. If there has been no high voltage breakdown of the frit seal after approximately 27 seconds, an appropriate circuit is energized to shut off the high-voltage power supply. The elevating means lifts the structure 22 vertically away from the supported cathode ray tube which may then be removed from supporting cradle 12.

The improvement according to the present invention comprises electrically conductive spring means 54 embracing elastomeric band 14 at its periphery. Spring means 54 indicated by way of example as being a coil spring, is attached to the band mounting means 15 for stretching and relaxing in concert with elastomeric band 14. The placement of spring means 54 and the means of attachment are shown in greater detail in FIGS. 2 and 3. Faceplate 4 is shown in a plan view in FIG. 2, with the funnel-faceplate interface 56 depicted in section. Spring means 54, which is attached to fingers 38 located at the corners of faceplate 4, is shown as embracing elastomeric band 14. Electrical leads 50 provide for grounding elastomeric band 14 and spring means 54.

Figure 2:
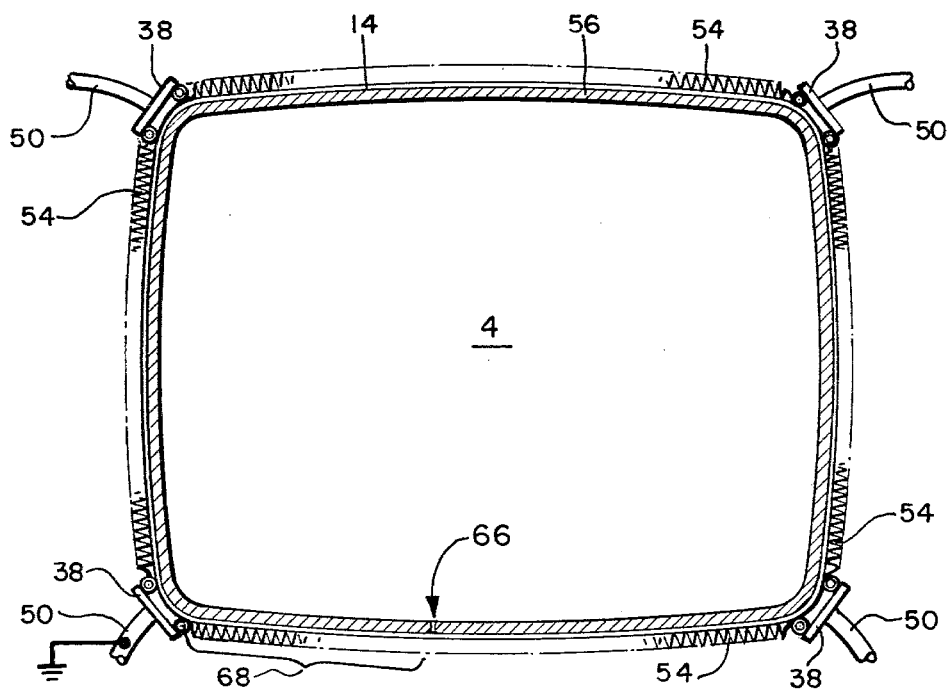
FIG. 2 is a plan view of a cathode ray tube faceplate showing in section a frit seal in conjunction with improved seal testing means according to the invention.
Figure 3:
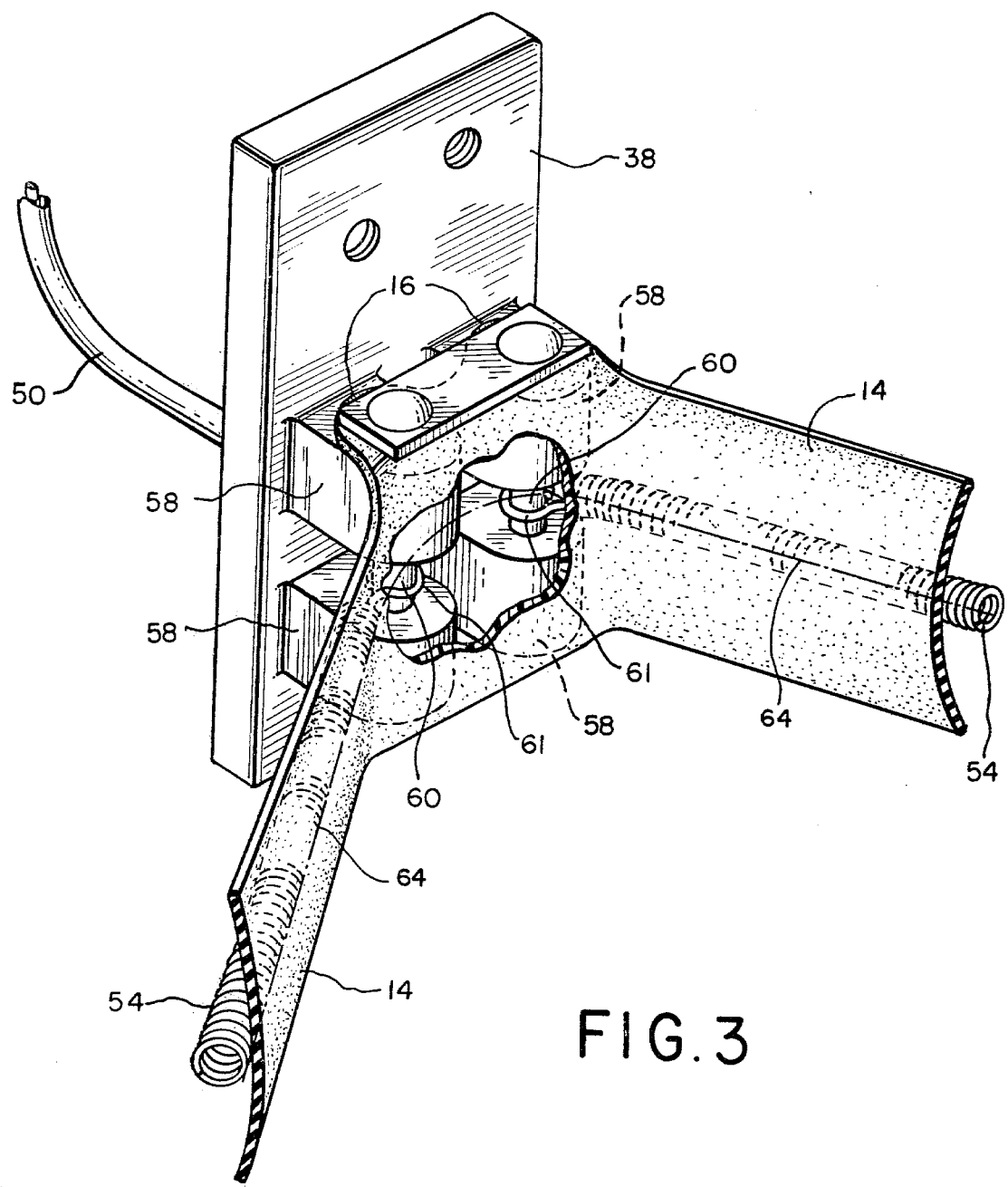
FIG. 3 is a view in perspective and partially in phantom showing details of the improved frit seal testing means according to the invention.

FIG. 3 shows in detail one of the fingers 38 as seen from the inner side wherein the attachment to band 14 is made. The attachment means is indicated by way of example as comprising four lugs 58 extending from the inner face of finger 38, and to which the ears 16 of band 14 are fastened by pin means 60. Spring means 54 are indicated by way of example as being attached respectively to the pins 60 by means of loops 61 which terminate the spring means. Pin means 60 are grounded through electrical lead 50. As finger 38 moves away from or toward the center of the hand 34, elastomeric band 14 and spring means 54 according to the invention are stretched and relaxed in concert. The effect is such that spring means 54 provides for more uniform grounding of the band means with respect to the frit seal, and with respect to the test voltage applied to the inner conductive coating. This benefit is indicated in FIG. 2 wherein a point of discontinuity 66 is shown as being relatively distant from the places of connection of the ground potential through either of the adjacent electrical leads 50 at the corners of faceplate 4. If the elastomeric band 54 is rendered appreciably electrically resistive in the interests of making it less brittle and less subject to rupture (less graphite in its composition), the resistance of the intervening area 68, indicated by the bracket, of band 54 may be of such value (e.g., 10 ohms) as to reduce the high test potential to a level wherein an electrical discharge through the discontinuity 66 does not occur. Hence, the discontinuity is undetected. However, the presence of the electrically conductive metallic spring means 54 according to the invention ensures that band 14 is uniformly grounded with respect to the frit seal. As a result, the full test potential is maintained across the frit seal at all points.

A further benefit is attained in that the additional inward pressure against the band 14 exerted by spring means 54 provides for more intimate electrical grounding contact of the band 14 with the frit seal of the cathode ray tube. The approximate line of maximum contact 64 of band 14 is indicated in FIG. 3 by the dash line.

Spring means 54 may be of the type supplied by Reid Tool Supply Company, Muskegon Heights, Michigan under part number ES-67 and the designation "music wire extension spring." The outside diameter of the spring is 0.312 and the wire diameter is 0.035 inch. The spring comprises 296 coils and its length is 11 inches. The 11-inch length may be used on all four sides of the cathode ray tube.

Other changes may be made in the above-described apparatus without departing from the true spirit and scope of the invention herein involved, and it is intended that the subject matter in the foregoing depiction shall be interpreted as illustrative and not in a limiting sense.

What is claimed is:

1. For use in the manufacture of a cathode ray tube, an apparatus for testing an hermetic, glass-like frit seal between the funnel and the faceplate of an in-process cathode ray tube wherein the inside of said funnel has a conductive coating adapted to receive a test voltage applied to an anode button on a wall of said funnel, and wherein a discontinuity in the hermetic seal causes a high voltage breakdown in the seal, said apparatus including:

an electrically conductive elastomeric band capable of being stretched over the tube so as to conform to said hermetic seal between said funnel and faceplate;

means for supporting and locating said cathode ray tube in a position to be tested;

band mounting means for holding said elastomeric band and for stretching said elastomeric band to a rectangular stretched configuration larger than the size of the faceplate of the tube to be tested, and for relaxing the band such that it makes a static fit around said hermetic seal on said tube and conforms intimately to said seal to make an uninterrupted electrical and mechanical engagement therewith; and means for applying a test voltage across the hermetic seal of said cathode ray tube between said conductive coating and said band;

an improvement comprising electrically conductive spring means embracing said elastomeric band at its periphery, said spring means being attached to said band mounting means for stretching and relaxing in concert with said elastomeric band, such that said spring means provides for more uniform grounding of said band with respect to said frit seal, and the added inward pressure against said band exerted by said spring means provides for more intimate electrical grounding contact of said band with said frit seal.

2. The apparatus defined by claim 1 wherein said spring means comprises at least one metallic coil spring.

* * * * *